United States Patent [19]

Lestrat et al.

[11] Patent Number: 5,396,498
[45] Date of Patent: Mar. 7, 1995

[54] INTEGRATED CIRCUIT WITH PERIPHERAL TEST CONTROLLER

[75] Inventors: Patrick Lestrat, Moirans; Regis Leveugle, Grenoble, both of France

[73] Assignee: Thomson CSF, Courbevoie Cedex, France

[21] Appl. No.: 804,838

[22] Filed: Dec. 6, 1991

[30] Foreign Application Priority Data

Dec. 7, 1990 [FR] France .................. 90 15348

[51] Int. Cl.⁶ .......................................... G06F 11/00
[52] U.S. Cl. ...................... 371/3; 371/22.5; 371/21.1
[58] Field of Search ............. 371/3, 21.1, 21.2, 22.1, 371/22.2–22.6, 27, 16.1, 21.3, 25.1; 324/73.1, 158 R

[56] References Cited

U.S. PATENT DOCUMENTS

| | | | |
|---|---|---|---|
| 4,764,926 | 8/1988 | Knight et al. | 371/25 |
| 4,910,734 | 3/1990 | Segawa et al. | 371/22.3 |
| 4,964,148 | 11/1990 | Nadeau-Dostie et al. | 371/21.1 |
| 5,048,021 | 9/1991 | Jarwala et al. | 371/22.3 |
| 5,132,973 | 7/1992 | Obermeyer | 371/21.1 |
| 5,218,680 | 6/1993 | Farrell et al. | 395/325 |
| 5,230,000 | 7/1993 | Mozingo et al. | 371/22.4 |
| 5,257,231 | 10/1993 | Masuda | 371/21.1 |

OTHER PUBLICATIONS

A. T. Dahbura et al.: "An Optimal Test Sequence for the JTAG/IEEE P1149.1 Test Access Port Controller", 1989 IEEE, pp. 56–60.
1989 IEEE Int'l Conf. on Computer Design: VLSI in Computers & Processors, Y. Zorian et al., "Designing fault–tolerant testable, VLSI processors using the IEEE P1149.0 Boundary–scan Architecture", p. 581.

Primary Examiner—Charles E. Atkinson
Assistant Examiner—Dieu-Minh Le
Attorney, Agent, or Firm—Meltzer, Lippe, Goldstein, Wolf, Schlissel & Sazer

[57] ABSTRACT

The instant invention relates to complex integrated circuits incorporating circuits for internal testing. The test controller has:
- a finite-state machine or status register (RE1 to RE4), the parallel outputs of which are looped back to the parallel inputs via a logic (LCB) which is also able to receive external control signals (TMS, TCK, TRST);
- multiplexers (MU1 to MU4) associated with the cells of the status register to allow for operation of the status register either in series or parallel;
- and a control signal generating stage (GSC) connected to the output of the register to supply control signals for other elements of the test: circuitry depending on the state defined by the status register.

According to the instant invention, it is proposed that the multiplexers be provided with additional inputs making it possible to store the state of at least certain control signals in these cells for the purpose of transmitting them later for observation. It thus becomes possible not only to test the states of the status register (to verify that the finite-state machine accepts all the states it is supposed to accept) but: also to test the control signals emitted by the controller in order to verify that the control signals emitted are the desired signals. Possible faults in the test circuitry itself are thus detected more rapidly.

5 Claims, 3 Drawing Sheets

INTEGRATED CIRCUIT WITH PERIPHERAL TEST CONTROLLER

FIELD OF THE INVENTION

The invention relates to integrated circuits and in particular to complex circuits requiring specific testing means incorporated within the integrated circuit itself.

BACKGROUND OF THE INVENTION

To enable the users of an integrated circuit to test the functioning of a hybrid board or module incorporating several integrated circuits interconnected among each other in a removable manner, testing systems incorporated in part within the integrated circuits themselves, and capable of cooperating with analogous systems included in the other integrated circuits of the board have been devised.

Standards have been established for that purpose, in particular IEEE Standard 1149.1 which defines the testing means to be incorporated in integrated circuits so that the test of a board may be possible from connection terminals of the board without disassembling the components.

In this Standard each of the integrated circuits incorporates a test circuit comprising in particular:
input/output pins reserved for the test;
an instruction register for storing test instructions entered from the pins reserved for the test;
a logical decoder for the instructions
a shift register with series and parallel inputs, serving mainly to contain test data coming either from the outside (in order to force a desired logical state on certain nodes) or from inside the integrated circuit (in order to observe the state of certain nodes),
a control circuit for the test operations, controlled by pins reserved for the test; the control circuit directly controls the instruction register and indirectly, depending on the instructions of the instruction register, the other registers, the multiplexers and other elements required for the test.

FIG. 1 shows an embodiment of the architecture of a test circuit capable of carrying out tests in conformity with the abovementioned Standard. This architecture will be described further on.

The tests that can be carried out with such a circuit are very complex; they comprise generating a great number of test vector sequences which are introduced into the integrated circuit by one of the test pins and in receiving test data vectors from the circuit, also through one of the test pins. The tests are carried out either on the integrated circuit alone (test by the manufacturer, for example) or on the integrated circuit in its environment (test of the circuit on a board and not dissociable from this board).

One of the problems encountered in test procedures is that the test results are reliable only if the internal test circuits themselves are functionally valid. However the test of a circuit takes much time and it is absolutely possible to use up unnecessarily much testing time to find out in the end that the test circuit itself was defective.

In this context it should be remembered that the test procedures constitutes a very important parameter of the manufacturing cost of a complex integrated circuit: each one the circuits must be tested individually and each very thoroughly. The time consumed in tests is considerable in the manufacturing process.

It is obviously difficult to test the testing circuit itself: this test would have to be controlled by another test circuit and other input pins, other control circuits etc. would have to be therefore used.

Additional functional tests of the integrated circuit which would indirectly show up the defects of the test circuit could also be provided. This would however increase the number of test sequences and their length considerably, resulting in considerable costs, especially when many test commands are possible. Verification in each possible case must then be provided for.

SUMMARY OF THE INVENTION

The instant invention proposes a particularly simple solution to bring out essential defects that could originate in the test circuit itself.

The invention applies essentially in the case of an integrated circuit comprising a circuit for the testing of the circuit, together with a controller comprising:
A finite-state machine (i.e. a status register comprising a plurality of cells whose parallel outputs are fed back to the parallel inputs through a logic circuit which is also able to receive external control signals);
Multiplexers associated with the cells of the status register and located between the logic circuit and the cells to enable operation of said status register either serially (i.e., as a shift register) or in parallel;
a control signal generating stage connected at the output of the register to supply control signals of the other elements (in particular registers, multiplexers, locking latches etc.) of the test circuit depending on the state defined by the status register.

According to the instant invention, it is proposed that the multiplexers located between the logic circuit and the cells of the status register be provided with additional inputs, making it possible to store in these cells the state of at least some of the control signals for the purpose of transmitting them for later observation.

It thus becomes possible not only to test the state of the status register (to verify that the finite-state machine takes all the states which it is supposed to take) but also to test the control signals emitted by the controller to verify that the control signals emitted are the desired signals. Possible defects of the test circuitry itself are thus detected more quickly.

The contents of the status register is emptied periodically (in the serial mode) when its contents are to be tested. If the control signals emitted by the controller are to be tested, the control signals are first loaded into the status register and the contents of the register are then transmitted to an output of the integrated circuit for analysis.

Obviously this process does not solve all of the testing problems (instances of disfunction which the test circuit is unable to detect will always be possible inside the test circuit) but the invention makes it possible to test directly one of the most strategic elements in the operation of the test circuit, i.e. the generation of the test control signals.

When the test circuit comprises an instruction register (as is generally the case) followed by a logical decoder to decode the instructions contained in the instruction register and the instruction register is associated with input multiplexers making it possible to operate the instruction register at will in series (i.e. as a shift register) or in parallel, the multiplexers are preferably also provided with additional inputs making it possible to store in the register logical signals taken from locked outputs of the instruction register. The output of the instruction register is another rather strategic element which the manufacturer of the integrated circuit should be able to test directly himself. The invention then enables the manufacturer of the circuit to affirm with certainty that the decoding logic (designed by the customer) does receive the desired instructions when such instructions are introduced into the instruction register.

It must be understood that one of the great difficulties in the design of these test circuits is the fact that the integrated circuits are designed at least in part by the buyer of the circuit, however based on design principles supplied by the manufacturer; it is therefore necessary for the design principles of the test circuits developed by the manufacturer to be sufficiently universal so as to function when the buyer-designer's application in an integrated circuit is not yet known, The greater ease with which a reliable test can be obtained, independently of the actual application of the buyer, is an important advantage of the instant invention.

DETAILED DESCRIPTION OF THE INVENTION

Figure 1:
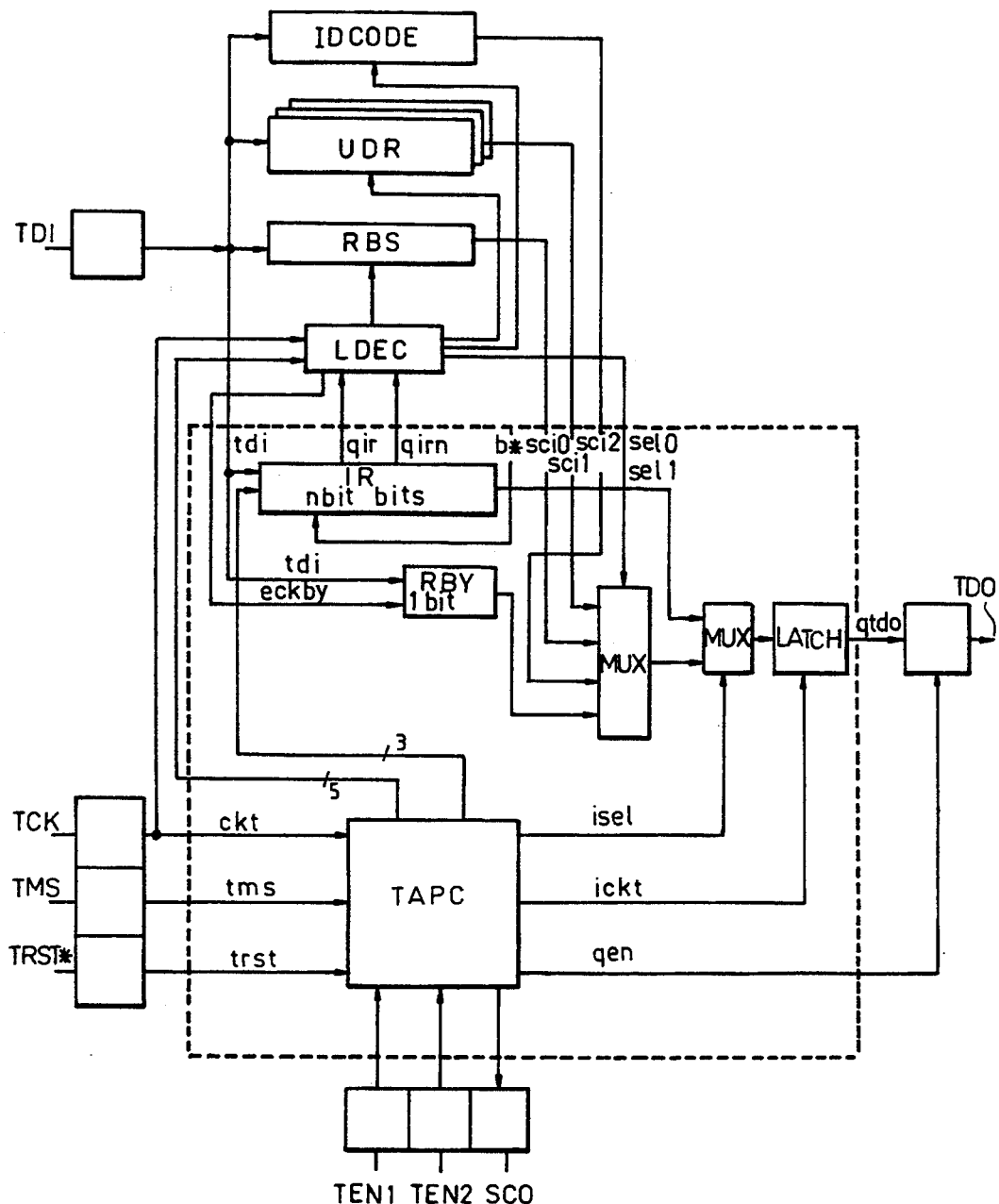
FIG. 1 shows an architecture of a test circuit into which the instant invention can be advantageously incorporated.

FIG. 1 shows a test circuit making it possible to establish so-called "peripheral" tests according to IEEE Standard 1149.1.

In this Standard the integrated circuit incorporating a test circuit comprises a shift register with serial and parallel inputs and outputs. The RBS register is connected to input/output pins of the integrated circuit so that signal values occurring on these pins can be observed or set to particular values determined in the course of a test phase. This RBS register is known as the "boundary scan register" or "peripheral test register".

The RBS register contains a cell associated with each input/output pin. When it operates in a parallel writing mode, it is possible to write the present states of the pins into the register; the register can then be read serially to transfer these states outside the integrated circuit for observing the functioning of the circuit. Alternatively, the RBS register can be written in a serial mode, wherein a sequence of logical states can be written from the outside into the register, following which the register is read in a parallel mode wherein the state values are placed on the different pins in order to force the desired states upon these pins in the course of a test phase.

The integrated circuit comprises a TDI pin by which the test data can be introduced serially into the RBS register when it operates as a shift register. The integrated circuit of FIG. 1 also comprises a TDO pin for serially shifting data out from the RBS register. The word pin as used in this description designates the complete assembly of a contact conductor pin and the interface circuit which is necessarily associated with it (input or output interface or bi-directional interface or three states, depending on the case).

In the organization of a board comprising several integrated circuits of this type, the different integrated circuits of the board or of the module to be tested have TDI's and TDO's: The TDI input of one circuit is connected to the TDO output of another. In this manner, when the RBS register functions as a shift register, all of the cells of the RBS register of an integrated circuit on the one hand constitute a shift register, and on the other hand, the RBS registers of several integrated circuits of the board can be connected in series to constitute one vast input register between an input terminal and an output terminal of the board.

At the input terminal of the board it is possible to introduce an instruction or data vector, i.e. a succession of logical values that are to be applied to different integrated circuits, whereby these logical values define either an instruction for a particular test to be carried out for each circuit, or test data to be processed in accordance with an instruction given previously. The tests pertain either to the internal functioning of the integrated circuits or to the interconnections between circuits. A vector of data resulting from the test is obtained through the board's output terminal. These data represent logical states of input/output pins of the different integrated circuits following the execution of a test instruction.

Not only the input/output pins can be tested in this manner through the shift register with parallel as well as series inputs. Any logical node of the circuit can be tested. This is why specific test registers which may be called user-defined registers are also provided and are indicated by reference UDR on the drawing. These registers operate like the RBS register, except that their cells are connected for observing and for setting the logical values of nodes of the circuit (not shown) other than input/output pins. Each of the UDR registers has a serial input connected to the TDI input pin and a serial output connected (indirectly) to the TDO output pin. Of course only one register at a time can function in the serial (i.e. shift register) mode, otherwise there would be a collision of data at the TDI or TDO pins. Multiplexers are therefore connected between the serial outputs of the registers and the TDO pin to define which register is connected at a given moment to the TDO pin. The instructions of the test define which is or are the register(s) that must function during an operation and in which mode they must operate.

This is why an instruction register IR is provided which can be loaded in series via the TDI pin and which also can be loaded in a parallel mode. This register is in turn connected by a serial output to the TDO pin (via a multiplexer) so that this register can be part of a large shift register connecting several integrated circuits in serial connection on one board.

The parallel outputs of the IR register define an instruction with n bits. These instructions are transmitted to a decoding logic LDEC which directly controls the selection and the operation of the registers RBS and UDR and, if applicable, the multiplexers interconnected between these registers and the TDO pin.

The decoding logic receives not only the instructions contained in the IR register but also control signals that are independent of the instructions and originating in a TAPC controller (Test Access Port Controller) which is the main control element of the test circuit and which is described further below.

The outputs of the instruction register are of course locked, at least during the execution of a phase in which the instruction register is loaded in series so that the decoding logic may not register randomly during this loading. Additionally, and contrary to the other test registers, the instruction register is not itself controlled by the LDEC decoding logic but is directly controlled by the TAPC controller.

Other registers with more specific functions can also be provided. They are also controlled by the LDEC decoding logic. In the example shown there is an RBY register with one bit which also has a series input connected to the TDI pin and a series output connected to the TDO pin through the intermediary of the multiplexers. It serves to by-pass the other registers if desired. This is the case for example when a large shift register is established between the TDI and TDO of several integrated circuits of one and the same board and when it is desired that this shift register may not extend through the RBS or UDR or IR registers of a particular integrated circuit.

Other registers, such as an IDCODE register identifying the manufacturer or the user may also be provided on the same principle as the other test registers.

The TAPC controller of the circuitry has the following global functions:

It supplies direct control signals to the instruction register IR in order to select same and to define its operating mode; it supplies control signals to the instruction decoding logic LDEC to control the other registers indirectly depending on the instructions that have been placed into the instruction register. It may also supply control signals for certain multiplexers and possibly of the latch, and a directional command or a third-state command of the TDO output pin if required;

and to supply these signals, the TAPC controller comprises essentially of a finite-state machine receiving external signals from some specific test pins which are in this case one TCK pin, one TMS pin and one TRST pin.

The TCK pin simply serves to receive external clocking signals making it possible to synchronize the test operations on several integrated circuits simultaneously since these circuits must be able to act at a certain moment as a large shift register.

The clock 'ckt" received from the TCK pin can also, as is shown, be applied directly to the LDEC instruction decoding logic or to other circuit elements, in particular to the registers requiring a clock signal in order to function.

The TMS pin makes it possible to have the current test cycle defined by the TAPC controller advance by one step when its state changes (state sampled for example on the rising edge of the clock ckt).

The TRST pin, when present, makes it possible to receive an asynchronous test logic re-initialization instruction and to transmit it to the TAPC controller. Finally, FIG. 1 shows three additional external input-/output pins which can more specifically serve to apply the instant invention and which in that case play the following roles:

The TEN1 pin and the TEN2 pin serve to transmit instructions to carry out tests of the test circuitry itself (i.e. a test of the control signals emitted by the TAPC controller, and preferably also a test of the locked parallel outputs of the instruction register IR).

The SCO pin serves to transmit externally the results of the tests carried out inside the test circuitry itself.

Figure 2:
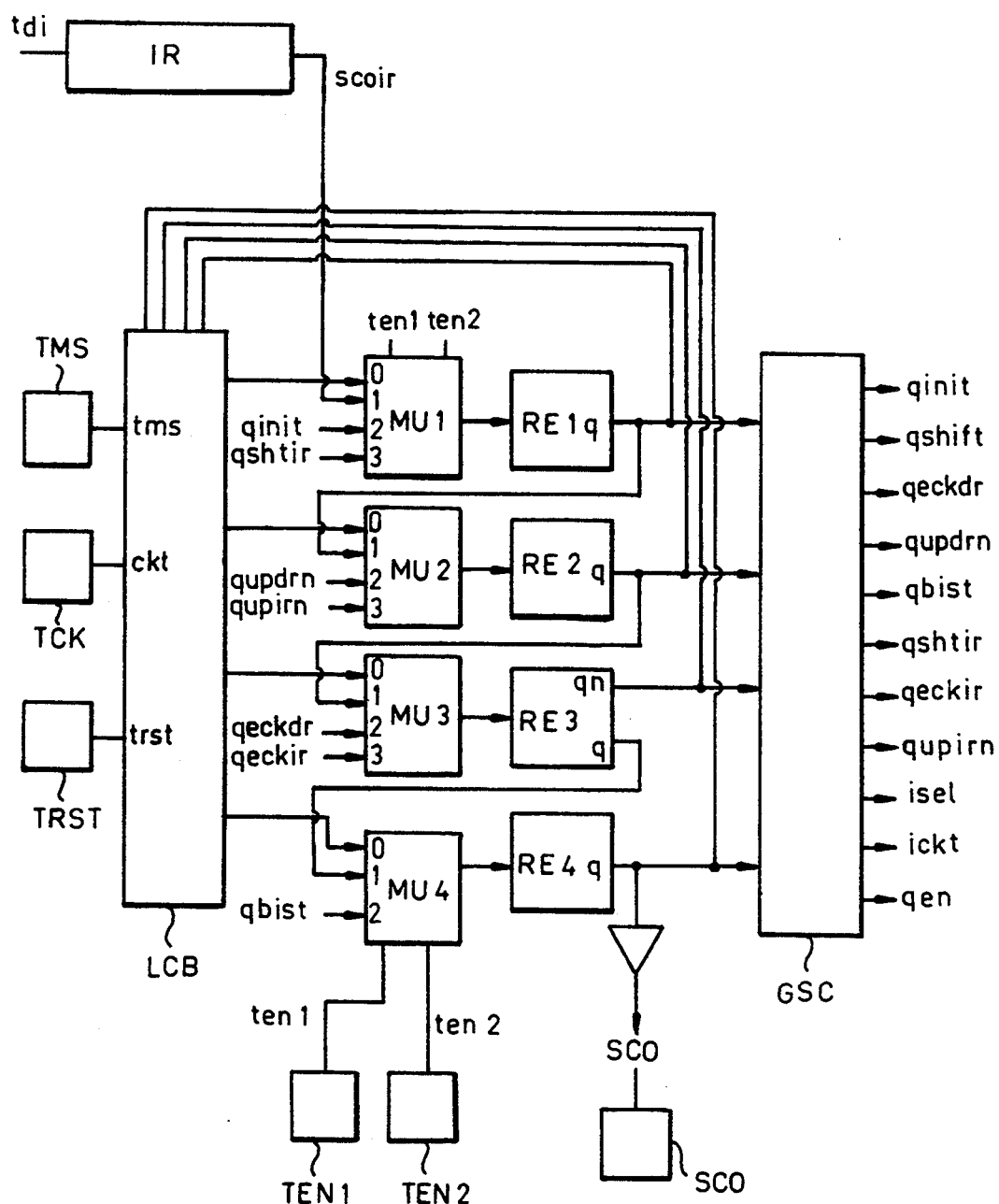
FIG. 2 shows the main controller of the test circuit of FIG. 1 in accordance with the instant invention.

With reference to FIG. 2, the structure of the TAPC controller and the test circuit according to the instant invention making it possible to verify very efficiently the proper operation of this controller shall now be described in greater detail.

The TAPC controller comprises mainly:

A finite-state machine, the state changes of which are defined by the "tms" signal present on the TMS pin, e.g. sampled on the rising edge of the clock "ckt" coming from the TCK pin. A finite-state machine is a sequencer capable of occupying one out of a limited number of states (e.g. 16) depending on the combination of the preceding state and external commands (here only the state changes of the TMS and TRST pins define such external commands); the state of the finite-state machine is defined by the contents of the cells RE1–RE4 of a status register, e.g. 4 binary cells for a maximum of 16 states.

A control signal generating stage which, starting from state signals defined by the status register of the finite-state machine, supplies control signals serving to control the test circuitry; this stage constitutes the output of the TAPC controller.

The logic which receives the outputs of the status register and the "tms" "ckt" and "trst" signals coming from the test control pins TMS, TCK and TRST is designated by LCB. This is the logic which completely defines the different possible state changes.

The output of this logic LCB supplies the new logical states that must be assumed by the cells RE1 to RE4 of the status register depending on the preceding state and on the external modification commands. But the outputs of the LCB logic are not applied directly to the cells RE1 to RE3. They are applied via multiplexers MU1 to MU4, the functions of which are explained below. In normal test operation of the integrated circuit, the multiplexers MU1 to MU4 simply let the logical levels supplied by the logic LCB go through to the cells RE1 to RE4. Only when it comes to test the interior of the test circuitry itself do these multiplexers play a different role.

The control signal generating stage, designated by reference GSC, constitutes the output stage of the TAPC controller; this is a logical decoder which receives the outputs of the status register and supplies different control signals to the registers, multiplexers and other elements of the test circuit when such elements must be commanded depending on the current test phase.

In the embodiment described more precisely here, the control signal generating stage GSC supplies the following control signals:

a) Test re-initialization signal:
qinit: signal constituting a re-initialization flag destined for all the test registers (in particular RBS, UDR) and for the instruction register (IR)

b) Control signals destined for the instruction decoding logic LDEC:
qshift: instruction to the test shift registers (more precisely of course that which is selected by the command decoding logic LDEC);
qeckdr: global validation of the clock of the test registers (in particular RBS, UDR);

qupdrn: global validation of the clock of the locking latches at test register output, qbist: flag indicating a specific state of the TAPC controller;

c) control signals applied directly to the instruction register IR without going through the instruction decoding logic LOEC:

qshtir: shift command qeckir: global validation of register clock.

qupirn: global validation of clock for the locking latches at output of the instruction register.

d) Miscellaneous signals:

isel: control signal of a multiplexer inserted between the series output of the instruction register and the TDO pin (see FIG. 1) in order to output the contents of the instruction register at the TDO pin;

ickt: locking command for latch interconnected upstream of the TDO pin;

qen: command to put the interface output of the TDO pin at a high impedance.

A certain number of these control signals are very important and their malfunctions are not easy to detect indirectly by means of tests conducted through the test registers RBS, UDR, etc. However, such detection is easier for other signals.

This is why the following is provided according to the instant invention: the most important control signals issued from the GSC stage can be stored in the latches RE1 to RE4 of the status register and they can then be transmitted to the outside for observation.

For this purpose the multiplexers MU1 to MU4 installed upstream of the status register cells are provided with inputs receiving the outputs of the GSC stage, and these multiplexers are controlled by signals (ten1 and ten2) which are not issued from the GSC stage.

In the example shown (although is not necessary) the multiplexers are controlled by signals coming from external pins. Depending on the number of multiplexer inputs a greater or smaller number of control signals are provided.

In the example illustrated there are four state cells RE1 to RE4; therefore four different information items coming from the GSC stage can be stored. However if it is deemed that a greater number of signals should be tested it is possible to provide each multiplexer with additional inputs. Eight signals can then be analyzed, but only four at one time. This case is shown in FIG. 2 and it requires at least two distinct control signals (ten1 and ten2).

In the example illustrated these signals are emitted from external pins TEN1 and TEN2 (although this is not necessary) and:

the first multiplexer MU1 has four inputs: normal input (i.e. input 0) to store the state defined by the logic LCB for the RE1 cell of the finite-state machine; an input (input 1) for the operation of the status register in a serial mode; an input (i.e. input 2) receiving the qinit signal so as to store it for later observation; an input (i.e. input 3) receiving the qshtir signal for the same purpose.

The other multiplexers may also have four inputs, one of which being a normal operational input of the register RE1-RE4 when it is loaded in the parallel mode, one input serially connected for receiving the output of the preceding cell and two inputs receiving two different control signals to be tested.

The cells of the register are connected serially for operation as a shift register when the signals ten1 and ten2 control the selection of the second input (i.e. input 1) of the multiplexers. The third input serves to introduce into the register the value of the signals qinit, qupdrn, qeckdr and qbist. The fourth input serves to introduce three other signals of the logic, the state of which should be verified: qshtir, qupirn, qeckir. These choices are of course only indicated as examples.

When the status register functions as a shift register, its contents are preferably output to an output pin SCO connected to the output of the last cell RE4 of the status register. The value of the signals stored in the status register is obtained through this output so that they may be tested. These signals are either normal values of the status register (introduced from the logic LCB) or the values of control signals at the output of the GSC logic.

In the preferred example illustrated, and because the goal is also to analyze signals contained in the instruction register IR, the series output ("scoir") of the instruction register IR is connected to the second input of the first multiplexer MU1. It is thus possible to successively obtain the signals stored in the status register and the signals stored in the IR register through the SCO pin.

In a preferred embodiment of the instant invention, the aim is indeed to test other signals which are the signals destined to control the decoding logic LDEC (FIG. 1) by using the instruction register IR. And this test will preferably be carried out simultaneously with the test using the status register.

Figure 3:
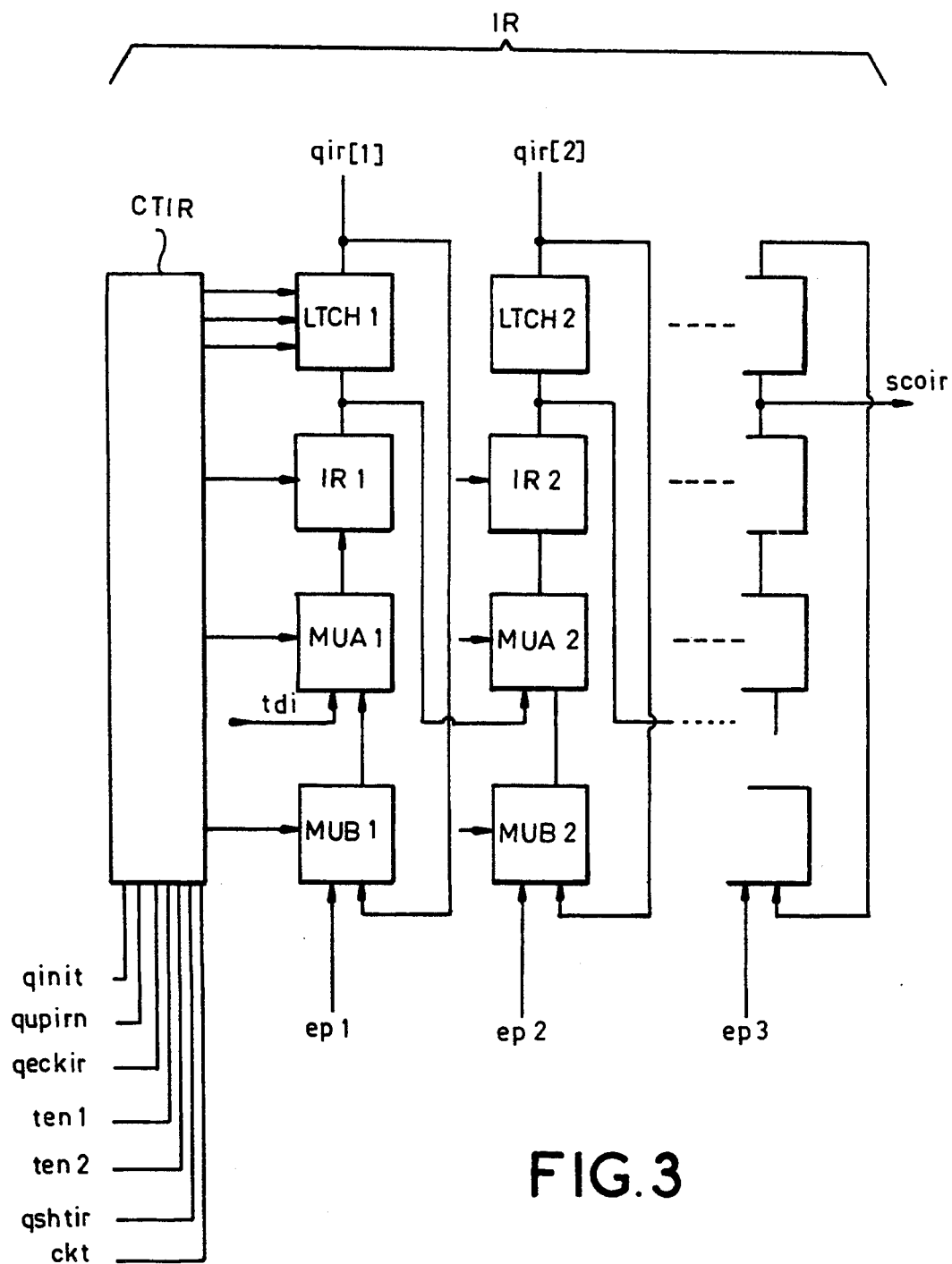
FIG. 3 shows a modified instruction register in accordance with an embodiment of the invention.

FIG. 3 shows the circuitry of the instruction register IR, modified for the purpose of a test using this register.

The IR register comprises n binary cells IR1, IR2, etc. Each such cell has an input for receiving a signal from a corresponding elementary multiplexer MUA1, MUA2, etc. and an output connected to a corresponding locking latch LTCH1, LTCH2, etc. serving to supply locked signals qir[1], qir[2]etc. The combination of these signals represents an output instruction of the IR register. This instruction is locked, i.e. it changes only when the locking latches are actuated.

The multiplexers MUA1, MUA2 make it possible to select the input signals applied to the cells IR1, IR2, etc. of the IR register. For one state of the multiplexers, the inputs are applied in parallel; for another state of the multiplexers, the functioning is that of a shift register: the output of one cell is applied to the input of the following one, the input of the first cell is connected to the input tdi, the output of the last cell is the "scoir" output shown in FIG. 2.

According to the invention another multiplexer MUB1, MUB2, etc. respectively is provided upstream of each of the multiplexers MUA1, MUA2, etc. These multiplexers make it possible to use either ep1, ep2, etc. signals representing an instruction that can be loaded in parallel into the register as parallel inputs of the register IR, or signals coming from the locking latches LTCH1, LTCH2, etc. These are signals that one wishes to reintroduce into the IR register (in which they originate) only for test purposes.

For this purpose the locking latch outputs are looped back, each to an input of the corresponding multiplexer MUB1, MUB2. Of course, when the existence of a second multiplexer MUB1 in addition to the multiplexer MUA1 is mentioned, this is the equivalent to stating that the multiplexer MUA1 has a greater number of parallel inputs and corresponding switching controls.

Like certain other registers of the test circuit, the IR register not only comprises the actual storage cells (which themselves are latches) but also an associated CTIR control circuit controlling the latches and multiplexers of the register. This CTIR control circuit receives:

the clock ckt;

the control signals issued from the GSC circuit (FIG. 2) and pertaining to the instruction register: qinit, qupirn, qeckir, qshtir for the normal operation of the register;

the control signals ten1 and ten2 for the test operation of the multiplexers MUB1, MUB2, etc. and of the cells IR1, IR2, etc.

On the basis of these signals the CTIR register issues:

a latch command for the cells IR1, IR2, etc.

a command for the selection of an input of the multiplexers MUA1, MUA2, etc.;

a command for the selection of an input of the multiplexers MUA2, MUA3, etc.;

a command for the loading of the state of the locking latches LTCH1, LTCH2, etc.;

and if required latch setting commands or commands for the resetting of these locking latches.

In the instant example, the series output of the instruction register (scoir output) goes to the series input of the status register (RE1 to RE4) so that the contents of the registers go successively to the output pin SCO, but this is not necessary; independent testing operations based on each of these two registers could be devised.

Globally, the testing of the test circuitry will take place before the testing of the actual integrated circuit.

The contents of the status register can be examined at a selected point in time (with the help of the signals ten1 and ten2); the outputs of the control signal generator GSC can be examined and the locked outputs of the instruction register can be examined.

And the results of these examinations are issued in sequence through the SCO output. The overall operation is effected under the control of the signals ten1 and ten2 at the desired points in time of an operating cycle of the finite-state machine and for desired instructions previously loaded into the instruction register.

In short, a test circuit for an integrated circuit has been devised wherein it is possible to directly observe from the outside control signals generated by the test circuit controller. Finally, the above-described embodiments of the invention are intended to be illustrative only. Numerous alternative embodiments may be devised by those skilled in the art without departing from the spirit and scope of the following claims.

We claim:

1. An integrated circuit comprising a built-in test circuit which tests said integrated circuit, said built-in test circuit comprising registers which store test vectors, and a controller which provides control signals for said registers, said controller comprising:

a finite state machine comprising a status register having several cells and parallel outputs, and a logical circuit which produces status signals to be introduced in said cells, a control signal generating stage connected to said parallel outputs of said status register, which provides said control signals depending on a state, as defined by the content of said status register of said finite state machine, said finite state machine further comprising multiplexers associated with said cells of said status register, means for introducing into a given one of said cells through said multiplexers one of said status signals, in a first mode of operation, or one of said control signals, in a second mode of operation, or the output of another one of said cells, in a third mode of operation, and means for serially transmitting from said cells towards an output of said controller, in said third mode of operation, control signals which have been produced in said first mode of operation and introduced in said cells in said second mode of operation, in order to check said introduced control signals.

2. Integrated circuit as claimed in claim 1, wherein said multiplexers are controlled by signals generated from outside said integrated circuit.

3. Integrated circuit as claimed in claim 1, wherein at least one pin is dedicated to outputting test results of said integrated circuit, and another pin is dedicated to receiving said output of said controller.

4. Integrated circuit as claimed in claim 1, wherein at least one of said registers for storing test vectors is an instruction register, and wherein said multiplexers comprise at least one input for receiving at least one output of said instruction register.

5. Integrated circuit as claimed in claim 4, further comprising a decoding circuit for decoding instructions contained in said instruction register, said control signals produced by said control signal generating stage including signals for controlling an operation of said decoding circuit.

* * * * *